(12) United States Patent
Park (10) Patent No.: US 10,338,100 B2
(45) Date of Patent: Jul. 2, 2019

(54) TEST SOCKET

(71) Applicant: LEENO INDUSTRIAL INC., Busan (KR)

(72) Inventor: Sang-Duck Park, Busan (KR)

(73) Assignee: LEENO INDUSTRIAL INC. (KR)

( * ) Notice: Subject to any disclaimer, the term of this patent is extended or adjusted under 35 U.S.C. 154(b) by 175 days.

(21) Appl. No.: 15/398,888

(22) Filed: Jan. 5, 2017

(65) Prior Publication Data

US 2017/0122977 A1  May 4, 2017

Related U.S. Application Data

(63) Continuation of application No. PCT/KR2015/002982, filed on Mar. 26, 2015.

(30) Foreign Application Priority Data

Aug. 22, 2014 (KR) .................. 10-2014-0109655

(51) Int. Cl.
*G01R 1/04* (2006.01)
*G01R 1/06* (2006.01)
(Continued)

(52) U.S. Cl.
CPC ....... *G01R 1/0466* (2013.01); *G01R 1/06722* (2013.01); *G01R 1/07314* (2013.01); *G01R 1/07371* (2013.01)

(58) Field of Classification Search
CPC ........ G01R 1/04; G01R 1/0466; G01R 1/067; G01R 1/06722; G01R 1/073; G01R 1/07314; G01R 1/07371
See application file for complete search history.

(56) References Cited

U.S. PATENT DOCUMENTS

| 4,781,624 A | 11/1988 | Shepherd | |
|---|---|---|---|
| 2004/0046583 A1* | 3/2004 | Fan | G01R 1/0466 324/756.02 |
| 2009/0325415 A1 | 12/2009 | Brist et al. | |

FOREIGN PATENT DOCUMENTS

| JP | 11-307210 A | 11/1999 |
|---|---|---|
| JP | 2010-043874 A | 2/2010 |

(Continued)

OTHER PUBLICATIONS

International Search Report(PCT/KR2015/002982), WIPO, dated May 22, 2015.

(Continued)

*Primary Examiner* — Son T Le
(74) *Attorney, Agent, or Firm* — Park & Associates IP Law, P.C.

(57) ABSTRACT

Disclosed is a test socket for inspecting an electronic device that is particular about properties.

The test socket for inspecting electric properties of a subject includes a plurality of probes configured to be retractable in an inspection direction; a probe supporter configured to support the plurality of probes so that first ends of the plurality of probes protrudes to contact with an object contact point of a subject; and a printed circuit board (PCB) configured to be placed beneath the probe supporter, be mounted with electronic parts, be formed with holes through which second ends of the plurality of probes pass, include at least one first pad with which at least one second end of the plurality of probes comes into contact and at least one second pad formed on an opposite side to the first pad, and be formed with electric paths extended from the first pad and the second pad and connected to the mounted electronic parts.

14 Claims, 9 Drawing Sheets

(51) Int. Cl.
    *G01R 1/07*     (2006.01)
    *G01R 1/067*    (2006.01)
    *G01R 1/073*    (2006.01)

(56) References Cited

FOREIGN PATENT DOCUMENTS

| | | | |
|---|---|---|---|
| JP | 2012-220438 A | | 11/2012 |
| JP | 2013-137241 A | | 7/2013 |
| KR | 10-2009-0130970 A | | 12/2009 |
| KR | 10-2011-0074814 A | | 7/2011 |
| KR | 20110074814 A | * | 7/2011 |
| KR | 10-2012-0012512 A | | 2/2012 |
| KR | 10-1193556 B1 | | 10/2012 |
| KR | 10-1269919 B1 | | 5/2013 |
| KR | 10-2013-0123193 A | | 11/2013 |
| TW | 201344212 A | | 11/2013 |
| TW | M481409 U | | 7/2014 |

OTHER PUBLICATIONS

Japanese Office Action (JP 2017-527520), JPO, dated Nov. 21, 2017.
Chinese Office Action (CN 201580044606.8), CNIPA, dated Nov. 28, 2018.

* cited by examiner

TEST SOCKET

REFERENCE TO RELATED APPLICATIONS

This application is a continuation of International Application No. PCT/KR2015/002982, filed Mar. 26, 2015, and claims priority to Korean Patent Application No. 10-2014-0109655, filed Aug. 22, 2014, the disclosures of each of these applications being incorporated herein by reference in their entireties.

FIELD OF THE INVENTION

Apparatuses and methods consistent with the exemplary embodiments relate to a test socket for inspecting electric properties of an electronic part, and more particularly to a test socket including a printed circuit board (PCB) with parts for inspecting an electronic device that is particular about properties.

BACKGROUND OF THE INVENTION

A semiconductor chip is formed with a fine electronic circuit by high-density integration, and during a fabrication process, each electronic circuit undergoes a test on whether it operates normally or abnormally.

For the test on the semiconductor chip, a contact probe, which electrically connects a terminal of the semiconductor chip and a contact point (pad) of an inspection circuit board for applying a test signal, has been used for semiconductor inspection. In general, the semiconductor chip includes terminals arranged having a very fine pattern. Thus, to perform the inspection by contact with the terminals having the very fine pattern, the contact probe needs to have a very fine size to be integrated and supported on a probe supporter.

Further, to minimize loss caused in the test of the test socket for inspecting the semiconductor chip particular about properties, the contact probe needs to have a short length to make a short signal path. However, if the contact probe has the short length, it is difficult to give the contact probe the elasticity enough to absorb pressure applied for the test.

To solve such problems, Korean Patent No. 10-1193556 has disclosed that a printed circuit board mounted with electronic parts and a test socket are integrated. Such a conventional test socket has a structure that a plurality of through holes are arranged in a printed circuit board, and an inner wall of each through hole is coated with a conductive film, and a contact probe (i.e. a conductive rubber) is placed in the through hole and connected to an electric part of the printed circuit board.

However, the conventional test socket is difficult to be used for inspecting a subject having a fine pitch since it has a structure that the contact probe (i.e. a conductive rubber), the electronic parts and a conductive path are formed in a single substrate.

Further, it is very complicated to design the test socket, and thus a production cost increases.

SUMMARY OF THE INVENTION

Technical Problem

One or more exemplary embodiments may provide a test socket including a PCB mounted with electronic parts, which is suitable for testing a subject having a fine pitch.

Another exemplary embodiment may provide a test socket including a PCB mounted with electronic parts, which has a simple structure to thereby reduce a production cost.

Technical Solution

According to an aspect of a first exemplary embodiment, there is provided a test socket for inspecting electric properties of a subject, the test socket includes a plurality of probes configured to be retractable in an inspection direction; a probe supporter configured to support first ends of the plurality of probes to protrude and make contact with an object contact point of a subject; and a printed circuit board (PCB) configured to be placed beneath the probe supporter, be mounted with electronic parts, include at least one first pad with which at least one second end of the plurality of probes comes into contact and at least one second pad formed on an opposite side to the first pad, and be formed with electric paths extended from the first pad and the second pad and connected to the mounted electronic parts.

The test socket may further include a lower supporter configured to be placed beneath the printed circuit board (PCB) and to include at least one first conductive portions making contact with the at least one second pad.

The printed circuit board (PCB) may be formed with at least one first hole through which a second end of the rest of the probe excepting the at least one probe contacted with the first pad passes; and the lower supporter may include at least one second hole through which the second end of the probe passed through the first hole passes.

The printed circuit board (PCB) may be formed with at least one first hole through which a second end of the rest of the probe excepting the at least one probe contacted with the first pad passes; and the lower supporter may include at least one second conductive portion with which the second end of the probe passed through the first hole contacts.

The printed circuit board (PCB) may include at least one third pad with which a second end of the rest of the probe excepting the at least one probe contacted with the first pad contacts and at least one fourth pad formed on an opposite side to the third pad; and the third pad and fourth pad may be electrically connected through a through hole connector.

The probe supporter may include a groove on a bottom thereof, and the printed circuit board (PCB) and the lower supporter may be at least partially accommodated in the groove.

The groove may include a second groove for accommodating the electronic parts therein.

The electronic part may include a resistor or a capacitor.

The probe making contact with the at least one first pad may be different from the probe passed through the first hole.

The conductive portion may be retractable in the inspection direction.

Advantageous Effects

The test socket including a PCB mounted with electronic parts according to exemplary embodiment is suitable for testing a subject having a fine pitch.

Further, the test socket has a simple structure to thereby reduce a production cost.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF THE INVENTION

Below, exemplary embodiments will be described in detail with reference to accompanying drawings. The following embodiments describe only configurations directly related to the present inventive concept, and the descriptions the other configurations will be omitted. However, it will be understood that the omitted configurations are not unnecessary in realizing an apparatus or system to which the inventive concept is applied. Further, like numerals refer to like elements throughout.

Figure 1:
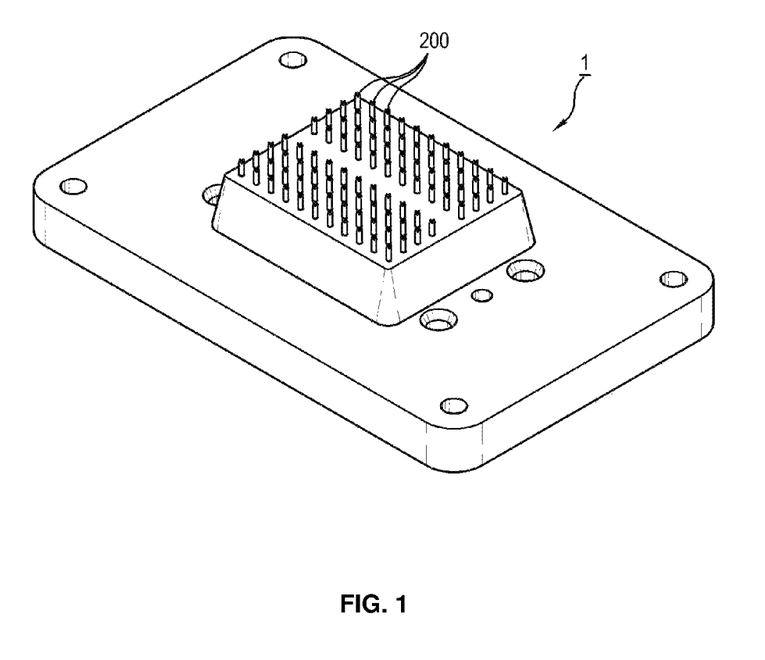
FIG. 1 is a perspective view of a test socket according to an exemplary embodiment.
Figure 2:
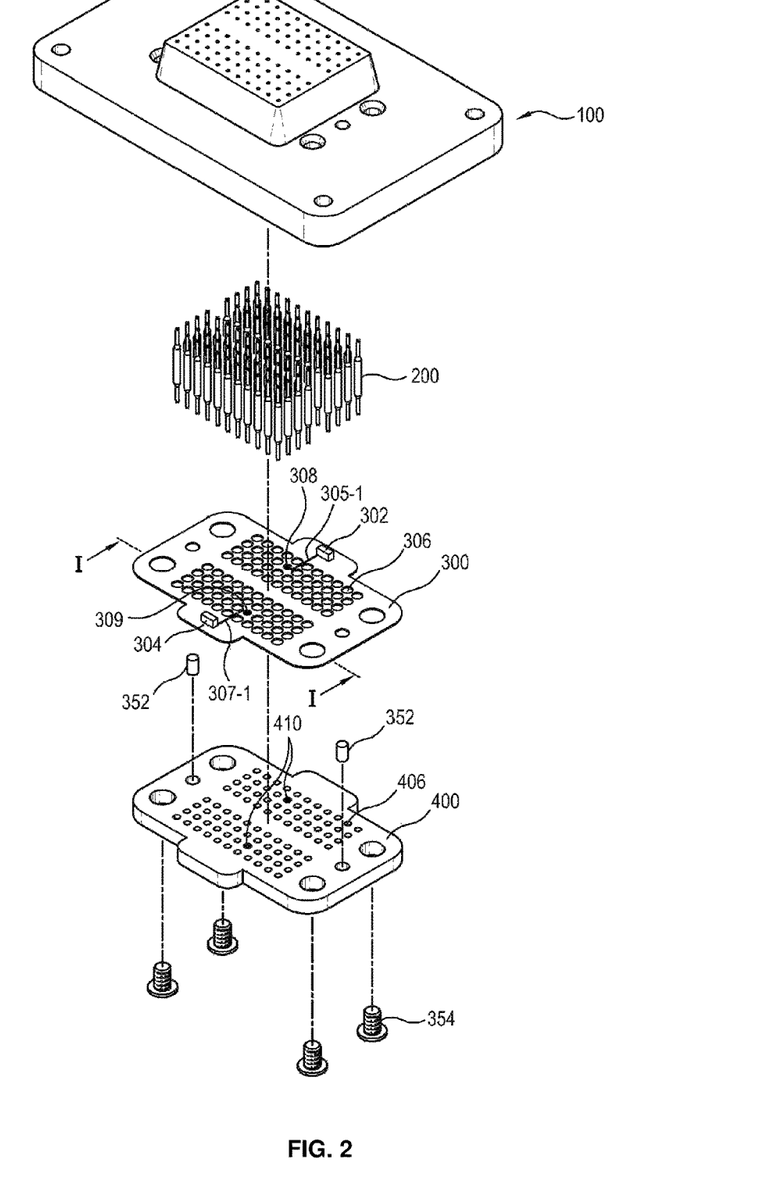
FIG. 2 is an exploded perspective view of the test socket of FIG. 1.
Figure 3:
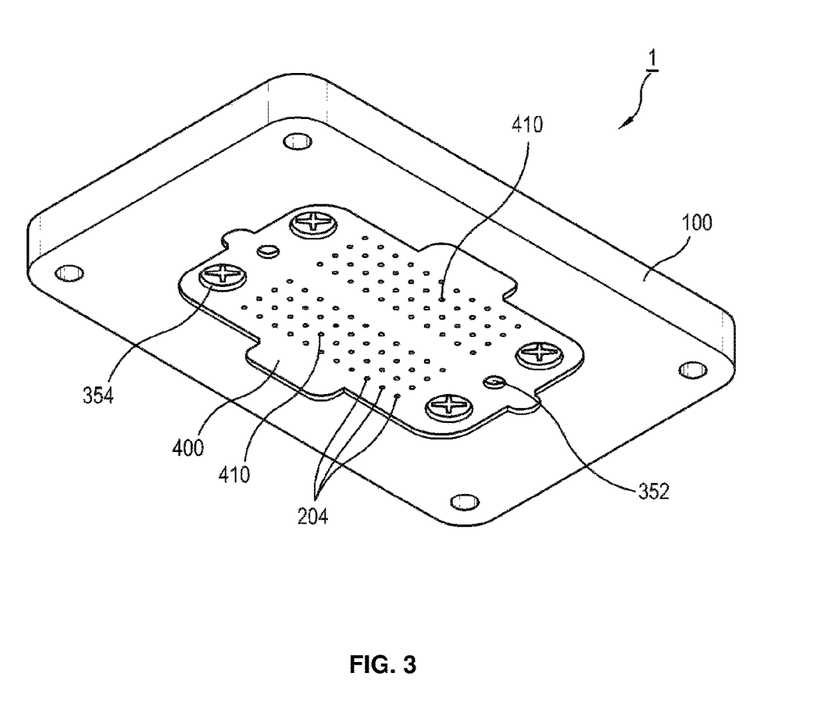
FIG. 3 is a bottom perspective view of the test socket of FIG. 1.
Figure 4:
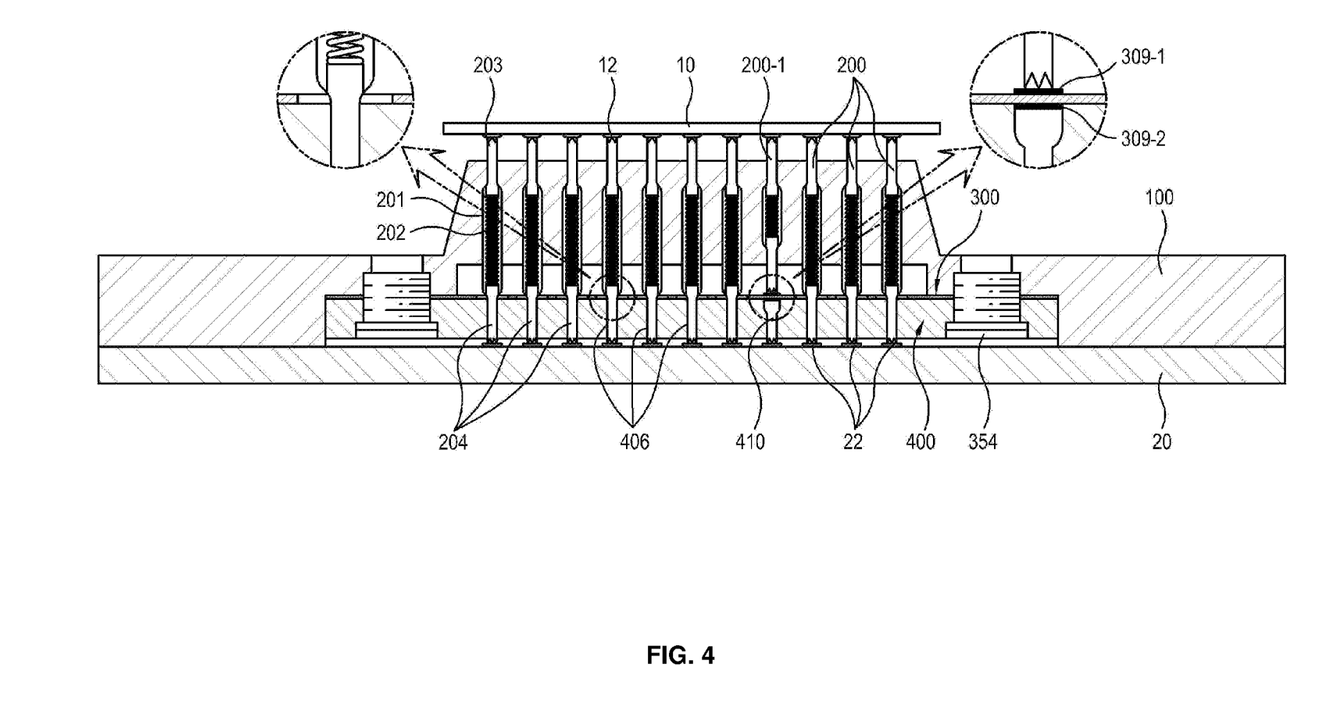
FIG. 4 is a sectional view of the test socket according to a first exemplary embodiment.

FIGS. 1 to 4 show a test socket 1 according to a first exemplary embodiment. As shown in FIG. 4, a test socket 1 inspecting electric properties of a subject 10 according to this exemplary embodiment for includes a probe supporter 100, a plurality of probes 200, a printed circuit board (PCB) 300 mounted with electronic parts 302 and 304, and a lower supporter 400.

The probe supporter 100 supports first ends (i.e. upper plungers 203) of the plurality of probes 200 to partially protrude. The partially-protruding first ends of the probes 200 may make contact with inspection points (i.e. bumps, etc.) 12 of the subject 10 at a test. At this time, second ends of the probes 200 are movable in an inspection direction by pressure applied to the subject 10 during the test.

The probe 200 is retractable in the inspection direction. The probe 200 may include a barrel 201, a spring 202 accommodated in the barrel 201, and upper and lower plungers 203 and 204 partially accommodated in the barrel 201 and arranged with the spring 202 therebetween. Of course, the probe 200 may have various shapes. For example, the probe 200 may include a movable plunger partially accommodated in one side of the barrel and movable to compress the spring, and a stationary plunger formed as a single body with the other side of the barrel.

The printed circuit board (PCB) 300 is arranged beneath the probe supporter 100, and mounted with at least one electronic part 302, 304, for example, a resistor, a capacitor, etc.

The printed circuit board (PCB) 300 may include first holes 306 through which the second ends (i.e. lower plungers) 204 of the plurality of probes 200 supported by the probe supporter 100 pass.

The printed circuit board (PCB) 300 may include a first pad 308-1, 309-1 with which the second ends (i.e. lower plungers 204-1) of some probes 200-1 among the plurality of probes 200 come into contact, and a second pad 308-2, 309-2 arranged on the rear of the PCB 300 and corresponding to the first pad 308-1, 309-1. The some probe 200-1 is shorter than the other probes 200

The printed circuit board (PCB) 300 may include a first electric path 305-1, 307-1 connected from the first pad 308-1, 309-1 of the upper side to the electronic part 302, 304, and a second electric path 305-2, 307-2 connected from the second pad 308-2, 309-2 of the lower side to the electronic parts 302, 304. The first electric path 305-1, 307-1 and the second electric path 305-2, 307-2 are respectively arranged on both sides of the printed circuit board 300.

The printed circuit board 300 includes a coupling hole 324 for coupling with the probe supporter 100 and an aligning hole 322 for alignment.

As shown in FIG. 4, the lower supporter 400 includes a second hole 406 through which the second end (i.e. the lower plunger) 204 of the probe 200 passes, and a conductive portion 410 inserted in the second hole 406 at a position corresponding to the second pad 308-2, 309-2.

The second end (i.e. the lower plunger) 204 of the probe 200 passing through the second hole 406 may come into directly contact with an inspecting contact point 22 of an inspection circuit 20 placed below. Further, the conductive portion 410 may have a first end to come into contact with the second pad 308-2, 309-2, and a second end to come into contact with the inspecting contact point 22 of the inspection circuit 20. In FIG. 4, the conductive portion 410 has a solid body that is not retractable in the inspection direction, but not limited thereto. Alternatively, the conductive portion may have a structure retractable in the inspection direction like the probe 200.

As shown in FIG. 4, the probe 200 passing though the second hole 406 may be longer than the probe 200-1 making contact with the first pad 308-1, 309-1.

In result, the first pad 308-1, 309-1 and the second pad 308-2, 309-2 may be connected to the electronic parts 302 and 304 through the first electric path 305-1, 307-1 and the second electric path 305-2, 307-2. Thus, a certain inspection signal is adjusted in properties through the electronic parts 302 and 304 and then transmitted to the inspecting contact point 22 of the inspection circuit 20 or to an object contact point 12 of the subject 10.

Referring to the bottom view of FIG. 3, the printed circuit board 300 and the lower supporter 400 are mounted to a groove on the bottom of the probe supporter 100, thereby reducing the total thickness of the test socket 1. The printed circuit board 300 and the lower supporter 400 may be fastened to the groove on the bottom of the probe supporter 100 by a fastening screw 354. Further, an aligning hole 408 and an aligning pin 352 may be used so that the probe 200 of the probe supporter 100, the first hole 306 and the first pad 308-1, 309-1 of the printed circuit board 300, and the second hole 406 and the conductive portion 410 of the lower supporter 400 can be precisely aligned.

Since the electronic parts 302 and 304 of the printed circuit board 300 protrude from a flat surface of the printed circuit board 300, the groove of the probe supporter 100 may further include a second groove for accommodating the electronic part therein.

Figure 5:
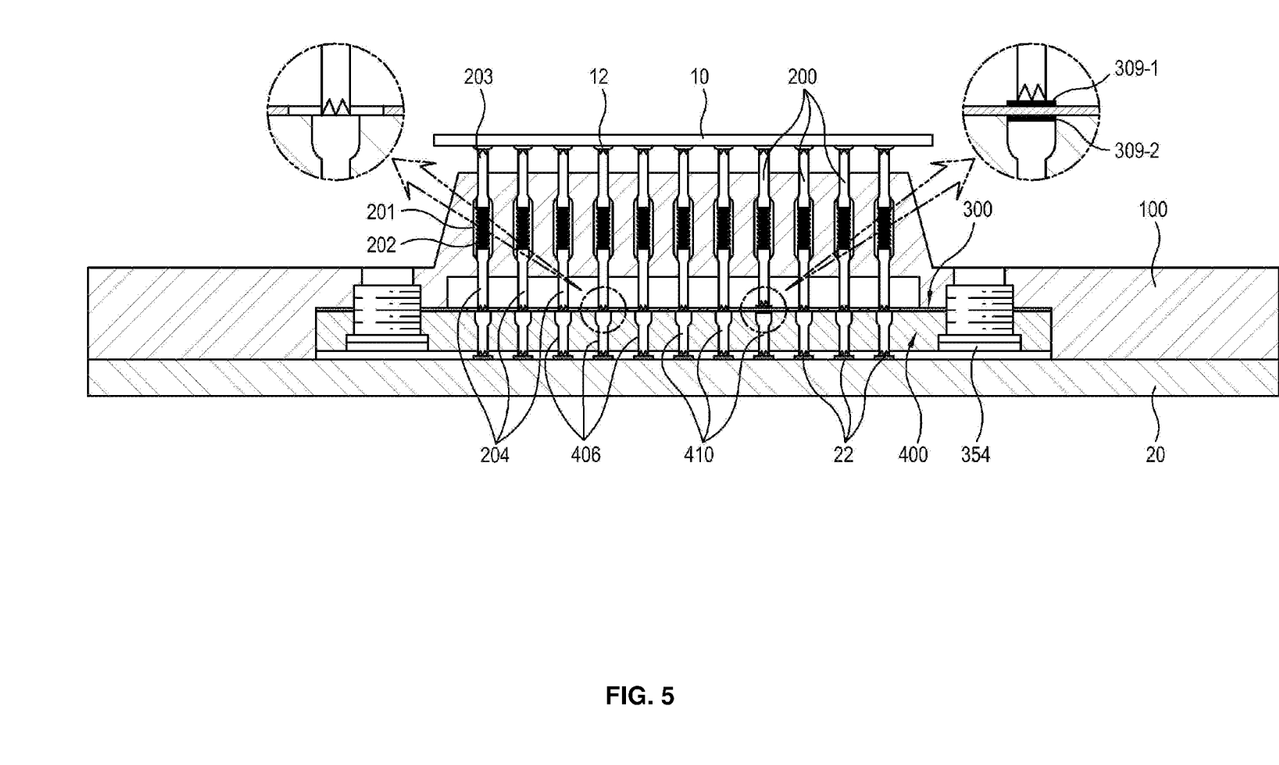
FIG. 5 is a sectional view of the test socket according to a second exemplary embodiment.

FIG. 5 shows a test socket 1 according to a second exemplary embodiment. Below, only differences in the test socket 1 between the first embodiment and the second embodiment will be described, and repetitive descriptions will be avoided.

As shown in FIG. 5, all the second holes 406 of the lower supporter 400 include the conductive portions 410, respectively. Therefore, the second end of the probe 200, which passes through the first hole 306 of the printed circuit board 300, among the plurality of probes 200 can make direct contact with the first end of the conductive portion 410. That is, the conductive portion 410 of the lower supporter 400 may serve to relay an inspection signal between the probe 200 and the inspecting contact point 22 of the inspection circuit 20. With this configuration, it is advantageously possible to use all the probes 200 supported on the probe supporter 100 with probes of the same design. In addition, a very thin flexible PCB is used as the printed circuit board 300, and it is therefore possible to use the probe making contact with the first pad 308-1, 309-1 and the probe passing through the first hole 306 with probes of the same design.

Figure 6:
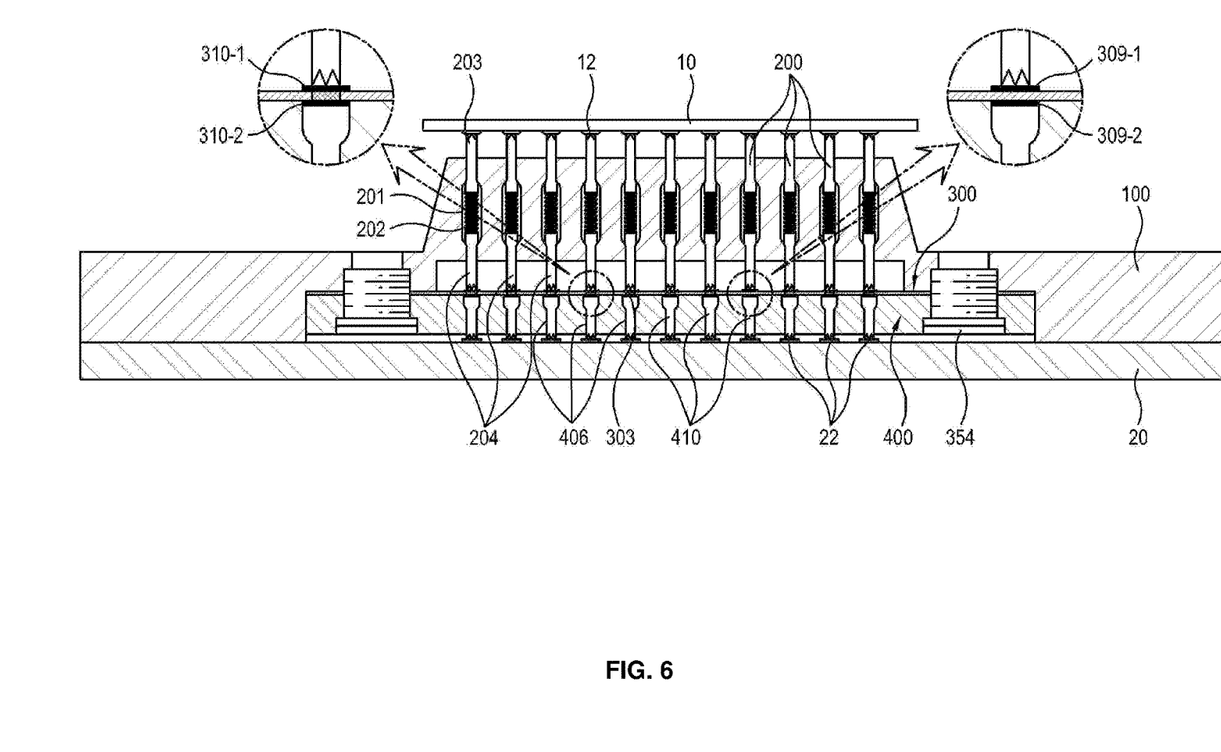
FIG. 6 is a sectional view of the test socket according to a third exemplary embodiment.
Figure 7:
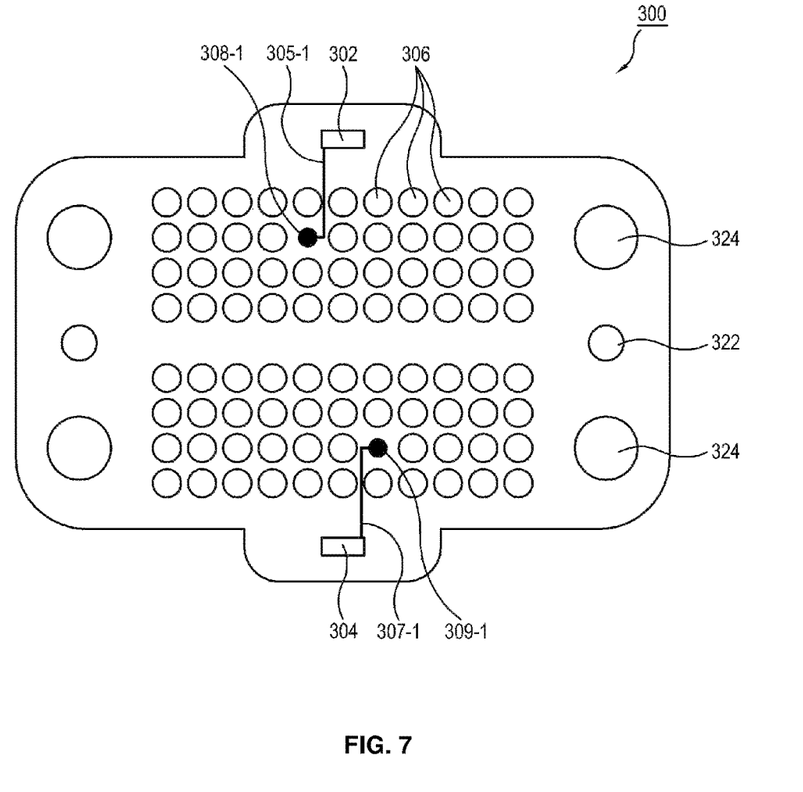
FIGS. 7 to 9 are a plan view, a bottom view and a right-side view of a printed circuit board (PCB) according to an exemplary embodiment.
Figure 8:
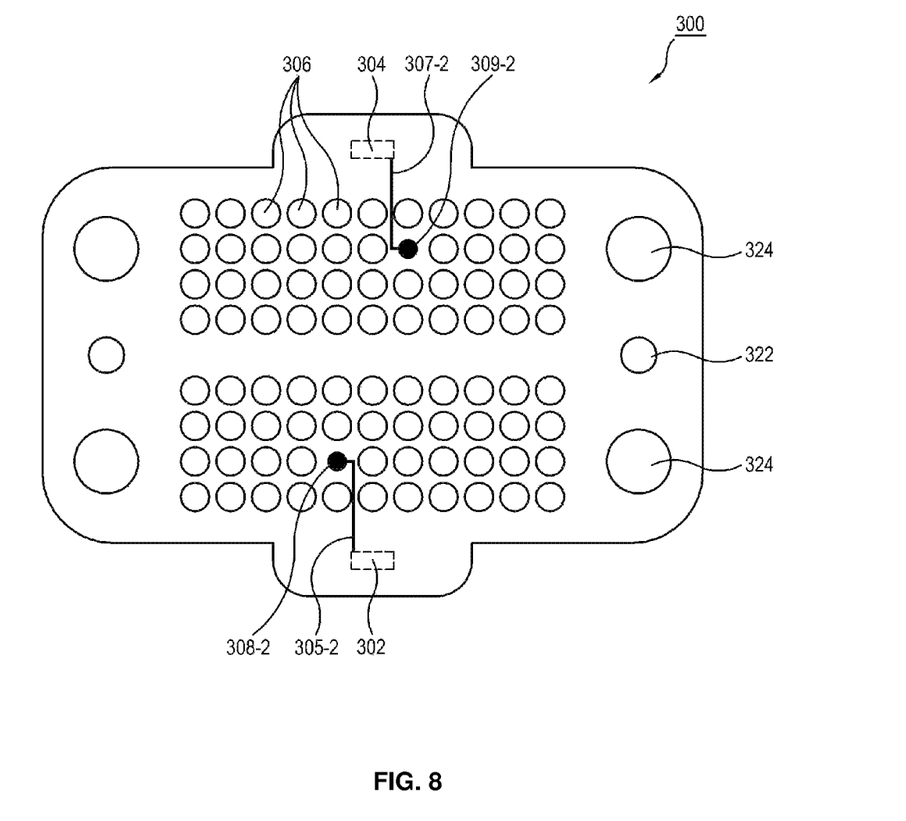
Figure 9:
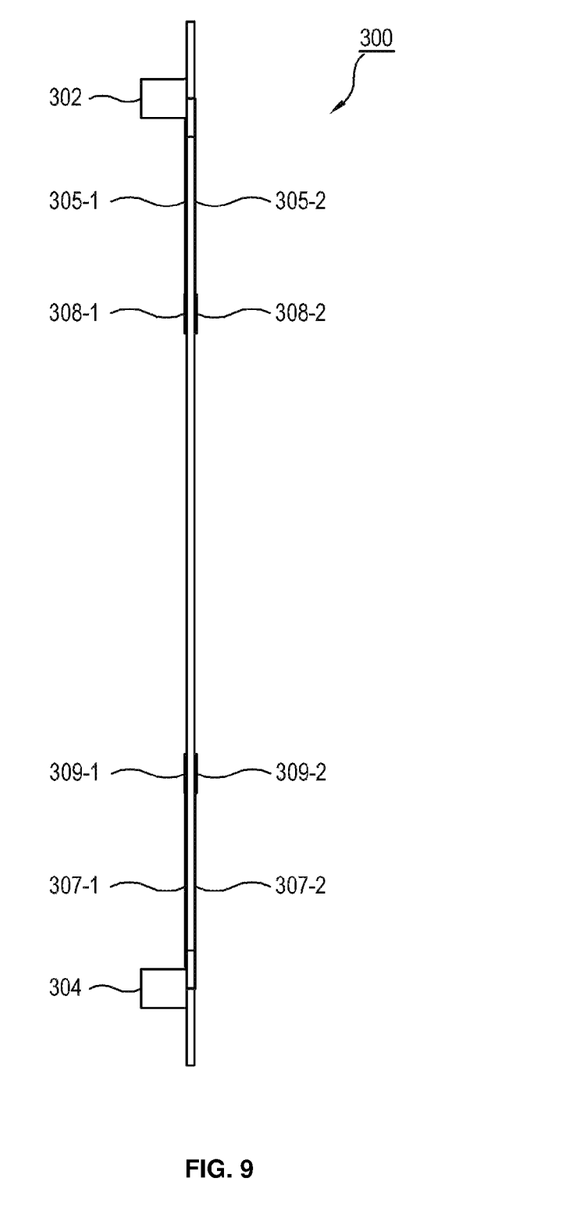

As shown in FIG. 6, according to a third exemplary embodiment, a plurality of first pads 310-1 corresponding to the plurality of probe 200 are formed on one side of the printed circuit board 300, and second pads 310-2 corresponding to the plurality of first pads 310-1 are formed on the other side. Then, the first pad 310-1 and the second pad 310-2 that have to be passed via electronic parts 302, 304 are connected to the electronic parts 302, 304 by first electric paths 305-1, 307-1 and second electric paths 305-2, 307-2, respectively. On the other hand, the first pad 310-1 and the second pad 310-2 that do not have to be passed via the electronic parts 302, 304 are directly connected by a third electric path (connector) like a through hole filled with a conductive material 303.

According to an exemplary embodiment, the PCB mounted with electronic parts is added to the test socket by a simple structure, thereby not only inspecting a subject having a fine pitch but also reducing a production cost.

Although a few exemplary embodiments have been shown and described, it will be appreciated by those skilled in the art that changes may be made in these exemplary embodiments without departing from the principles and spirit of the invention. Therefore, the foregoing has to be considered as illustrative only. The scope of the invention is defined in the appended claims and their equivalents. Accordingly, all suitable modification and equivalents may fall within the scope of the invention.

What is claimed is:

1. A test socket for inspecting electric properties of a subject, the test socket comprising:
    a plurality of probes configured to be retractable in a longitudinal direction, each of the probes having a first end and a second end opposite to each other, and the plurality of probes including a first group of probes and a second group of probes;
    a probe supporter configured to support the plurality of probes such that the first ends of the plurality of probes are to protrude outward to contact with an object contact point of a subject;
    a printed circuit board (PCB) configured to be placed beneath the probe supporter and being mounted with electronic parts, the printed circuit board (PCB) having at least one first pad attached thereto and to which the second ends of the first group of probes come into contact, and at least one second pad attached thereto on an opposite side to the first pad, and with electric paths extended from the first pad and the second pad, respectively, and connected to the mounted electronic parts; and
    a lower supporter configured to be placed beneath the printed circuit board (PCB) and having at least one first conductive portion in contact with said at least one second pad,
    wherein the printed circuit board (PCB) includes a plurality of first holes and the lower supporter includes a plurality of a plurality of second holes, the first holes and the second holes arranged at locations corresponding to each other,
    wherein the second ends of the second group of probes pass through the first holes of the printed circuit board (PCB) and through the second holes of the lower supporter.

2. The test socket according to claim 1, wherein the probe supporter comprises a groove on a bottom thereof, and the printed circuit board (PCB) and the lower supporter are at least partially accommodated in the groove.

3. The test socket according to claim 2, wherein the groove comprises a second groove for accommodating the electronic parts therein.

4. The test socket according to claim 1, wherein the electronic part comprises a resistor or a capacitor.

5. The test socket according to claim 1, wherein the probe making contact with the at least one first pad is different from the probe passed through the first hole.

6. The test socket according to claim 1, wherein the at least one first conductive portion is retractable in the longitudinal direction.

7. A test socket for inspecting electric properties of a subject, the test socket comprising:
    a plurality of probes configured to be retractable in a longitudinal direction, each of the probes having a first end and a second end opposite to each other, and the plurality of probes including a first group of probes and a second group of probes;
    a probe supporter configured to support the plurality of probes such that the first ends of the plurality of probes are to protrude outward to contact with an object contact point of a subject;
    a printed circuit board (PCB) configured to be placed beneath the probe supporter and being mounted with electronic parts, the printed circuit board (PCB) having at least one first pad attached thereto and to which the second ends of the first group of probes come into contact, and at least one second pad attached thereto on an opposite side to the first pad, and with electric paths extended from the first pad and the second pad, respectively, and connected to the mounted electronic parts; and
    a lower supporter configured to be placed beneath the printed circuit board (PCB) and having at least one first conductive portion in contact with said at least one second pad,
    wherein the printed circuit board (PCB) includes a plurality of first holes and the lower supporter includes a plurality of a plurality of second holes, the first holes and the second holes arranged at locations corresponding to each other,
    wherein the second ends of the second group of probes pass through the first holes of the printed circuit board (PCB),
    wherein the lower support includes a plurality of second conductive portions, and the second ends of the second group of probes passed through the first holes of the printed circuit board (PCB) are in contact with the second conductive portions of the lower supporter.

8. The test socket according to claim 7, wherein the probe supporter comprises a groove on a bottom thereof, and the printed circuit board (PCB) and the lower supporter are at least partially accommodated in the groove.

9. The test socket according to claim 7, wherein the electronic part comprises a resistor or a capacitor.

10. The test socket according to claim 7, wherein at least some of the conductive portions are retractable in the longitudinal direction.

11. A test socket for inspecting electric properties of a subject, the test socket comprising:
- a plurality of probes configured to be retractable in a longitudinal direction, each of the probes having a first end and a second end opposite to each other, and the plurality of probes including a first group of probes and a second group of probes;
- a probe supporter configured to support the plurality of probes such that the first ends of the plurality of probes are to protrude outward to contact with an object contact point of a subject;
- a printed circuit board (PCB) configured to be placed beneath the probe supporter and being mounted with electronic parts, the printed circuit board (PCB) having at least one first pad attached thereto and to which the second ends of the first group of probes come into contact, and at least one second pad attached thereto on an opposite side to the first pad, and with electric paths extended from the first pad and the second pad, respectively, and connected to the mounted electronic parts; and
- a lower supporter configured to be placed beneath the printed circuit board (PCB) and having a plurality of conductive portions arranged therein,
- wherein the printed circuit board (PCB) includes a plurality of first holes and the lower supporter includes a plurality of a plurality of second holes, the first holes and the second holes arranged at locations corresponding to each other,
- wherein the printed circuit board (PCB) further includes a plurality of third pads attached thereto and to which the second ends of the second group of probes come into contact, and a plurality of fourth pads attached thereto on an opposite side to the third pads, with a through hole connector filled in the first holes of the printed circuit board (PCB) to make the third and fourth pads in electrical connection to each other.

12. The test socket according to claim 11, wherein the probe supporter comprises a groove on a bottom thereof, and the printed circuit board (PCB) and the lower supporter are at least partially accommodated in the groove.

13. The test socket according to claim 11, wherein the electronic part comprises a resistor or a capacitor.

14. The test socket according to claim 11, wherein at least some of the conductive portions are retractable in the longitudinal direction.

* * * * *